United States Patent [19]

Glocker et al.

[11] Patent Number: 4,637,869

[45] Date of Patent: Jan. 20, 1987

[54] DUAL ION BEAM DEPOSITION OF AMORPHOUS SEMICONDUCTOR FILMS

[75] Inventors: David A. Glocker, West Henrietta, N.Y.; John R. Miller, Shaker Heights, Ohio; Scott F. Grimshaw, Jordan, N.Y.; Henry Windischmann, Solon, Ohio

[73] Assignee: The Standard Oil Company, Cleveland, Ohio

[21] Appl. No.: 814,837

[22] Filed: Dec. 30, 1985

Related U.S. Application Data

[63] Continuation-in-part of Ser. No. 647,208, Sep. 4, 1984, abandoned, and a continuation-in-part of Ser. No. 653,168, Sep. 24, 1984, abandoned.

[51] Int. Cl.$^4$ ............... C23C 14/14; C23C 14/16; C23C 14/18; C23C 14/46
[52] U.S. Cl. ............................. 204/192.11; 136/258
[58] Field of Search ............ 204/192 C, 192 S, 192 P, 204/192 SP

[56] References Cited

U.S. PATENT DOCUMENTS 4,376,688  4/1983  Ceasar et al. ................. 204/192 S

FOREIGN PATENT DOCUMENTS 149549  3/1981  German Democratic Rep. .
47-49987  4/1972  Japan .

OTHER PUBLICATIONS

Coluzza et al., a–Si:H Produced by Double Ion Beam Sputtering, 59 & 60 J. Non–Crystalline Solids (1983), pp. 723–726.
Cuomo and Harper, Multi Component Film Deposition By Target Biasing, IBM Tech. Disc. Bull., Jul. 1980, 817–818.
Brodsky and Cuomo, Doping of Sputtered Amorphous Semiconductors, IBM Tech. Disc. Bull., May 1977, 4802–4805.

Primary Examiner—Howard S. Williams
Attorney, Agent, or Firm—Jeffrey A. Wyand; Joseph G. Curatolo; Larry W. Evans

[57] ABSTRACT

A sputtering process for efficiently preparing amorphous semiconducting films having a reduced number of localized states is disclosed. In particular, hydrogenated semiconductor films free of polyhydrides may be prepared according to the inventive process. In one application of the process, a silicon target is simultaneously bombarded by separate beams of relatively heavy sputtering ions, such as argon ions, effective in sputtering the target at relatively high rates, and by ions of a substance effective in passivating localized states in amorphous semiconducting films, such as hydrogen ions. The products of this sputtering process are collected on remotely located substrates to form a passivated amorphous semiconductor film. In another application of the process, a target composed of a semiconductor alloy is used with separate sputtering and passivating ion beams directed at the target to deposit a passivated compound semiconductor film. In still another application, one pair of two pairs of sputtering and passivating ion beams are employed to sputter each of two separate elemental semiconductor targets and to deposit a passivated compound semiconductor film. Films deposited according to the invention may be doped and junction structures formed in them during deposition by adding ions of a gaseous dopant to the beam or beams of passivating ions.

18 Claims, 7 Drawing Figures

DUAL ION BEAM DEPOSITION OF AMORPHOUS SEMICONDUCTOR FILMS

This application is a continuation-in-part of U.S. patent application Ser. No. 647,208 filed Sept. 4, 1984 and a continuation of U.S. patent application Ser. No. 653,168 filed Sept. 24, 1984, both now abandoned.

BACKGROUND

Amorphous semiconductor films having a sufficiently small density of localized states have been recognized as having many potential applications, including in photovoltaic devices. Hydrogen and fluorine have been recognized as effective in reducing the density of localized states, i.e., passivating, amorphous silicon films. With respect to hydrogen passivation of amorphous silicon, it has been found that the particular coordination of the hydrogen atoms with silicon atoms in hydrogenated amorphous silicon films (a-Si:H) has a dramatic effect on the electronic properties of those films. Films having the most desired electronic characteristics have large silicon monohydride concentrations relative to the concentration of polyhydrides. In fact, for electronic device quality material it is desired that only silicon monohydrides be present and that silicon polyhydrides be entirely absent from a-Si:H films.

Typically, hydrogenated amorphous silicon has a measured band gap energy of 1.7 to 1.8 eV meaning no electrical charge carriers can be generated in those films by photons having an energy less than that band gap energy. Therefore a significant amount of solar energy cannot be converted to electrical energy by amorphous, hydrogenated silicon films. On the other hand, if the band gap energy of a film is too low, the efficiency of the semiconductor film in generating charge carriers in response to incoming photons is reduced. Various semiconductor materials have band gap energies lower than that of amorphous silicon, but are unsuited for photovoltaic cells for numerous reasons, including the difficulty and expense of preparation. An ideal band gap energy, compromising efficiency of charge carrier generation and responsiveness to the energy range of photons present in solar illumination, is about 1.4 eV.

It is known that alloys of elemental semiconductors having band gap energies intermediate those of the constitutent elements can be prepared. For example, single crystal alloys of germanium and silicon have band gap energies between their elemental values (0.7 eV and 1.1 eV, respectively) depending upon the relative proportions of germanium and silicon in the alloy. The same band gap energy grading observed in crystalline alloys occurs in passivated amorphous compound semiconductor films, but amorphous semiconductor alloy films having satisfactory electronic properties have been difficult to prepare.

Numerous processes have been employed to produce a-Si:H films. Among the deposition techniques that have been used are glow discharge and radio frequency and ion beam sputtering. An example of ion beam sputtering using a single ion gun is disclosed in U.S. Pat. No. 4,376,688 to Ceasar et al. There, a mixed beam of hydrogen and argon ions produced by a single ion source bombarded a silicon target to produce a hydrogenated silicon film relatively free of polyhydrides. The single ion beam energy and current of the mixed ion beam limit the sputtering efficiency of that process for any particular degree of hydrogenation. For example, when the hydrogen concentration in the single ion beam source was increased from zero to 75 percent to achieve film hydrogenation, the rate of film deposition fell from 3 micrometers per hour to 0.6 micrometers per hour. Dual ion beam sputtering was reported by Coluzza and others in an article "a-Si:H Produced by Double Ion-Beam Sputtering" in 59 and 60 Journal of Non-Crystalline Solids, 723–726 (1983). In that article, the authors disclosed directing a sputtering ion beam (argon) at a silicon target and a passivating ion beam (hydrogen) at the substrate on which the sputtered amorphous silicon was condensed. No improvement was achieved in controlling the amount and form of hydrogen content of the film deposited by the Coluzza et al. dual ion beam sputtering technique. East German patent No. 149,549 to Hinneberg et al. alludes to multiple ion beam sputtering of semiconductor films using beams of noble gas ions and hydrogen or halogen ions, all at energies of 1 keV to 20 keV. Hinneberg et al. do not mention any attempt to determine or control the hydrogen-semiconductor coordination in deposited films. Their only example uses a single ion beam of mixed sputtering and hydrogen ions.

SUMMARY OF THE INVENTION

In the invention, the problem of controlling the type of hydrogen-semiconductor bonding to produce electronic quality amorphous silicon and amorphous compound semiconductor films in an efficient sputtering process is solved. Control of the bonding to maximize monohydride concentration relative to the polyhydride concentration is achieved by use of separate sputtering ion and hydrogen ion beams, both simultaneously directed at the sputtering target. The use of separate beams permits independent control of the energies and beam currents of the two types of ions. The relatively heavy sputtering ions are used as in a conventional sputtering process, at relatively high energies, to sputter semiconductor atoms from a target efficiently. In contrast, the passivating ions, such as hydrogen ions, are preferably maintained at a low energy, less than about 200 electron volts, to achieve the desired hydrogen concentration and bonding in the film. Both ion beams are simultaneously directed at a target composed of an elemental semiconductor, such as silicon or germanium, or at an alloy target, such as a germanium-silicon alloy. The sputtering products are collected on a substrate, such as a glass, metal or semiconductor. The collected film incorporates atoms from the target and atoms from the passivating ion beam. Two pairs of ion beams may also be used, with separate targets, preferably of elemental semiconductors, to deposit an alloy film. In that embodiment, one sputtering and passivating beam is directed at each target. Fourier transform infrared (FTIR) absorption analysis shows that amorphous hydrogenated silicon films deposited according to the invention are free of polyhydrides. Deposition rates, in relation to film hydrogen concentration, are improved over known processes.

The deposited films may be doped by injecting a gaseous dopant, such as phosphine, or boron trifluoride or diborane, into the source or sources producing the passivating ion beams. The deposition process may be enhanced by illuminating the substrate with ultraviolet light, by heating the substrate and/or by bombarding the substrate with ions or electrons during the deposition.

The invention can be understood more clearly by reference to the drawing figures taken in conjunction with the detailed description that follows.

DETAILED DESCRIPTION OF PREFERRED EMBODIMENT

Figures 1, 2:
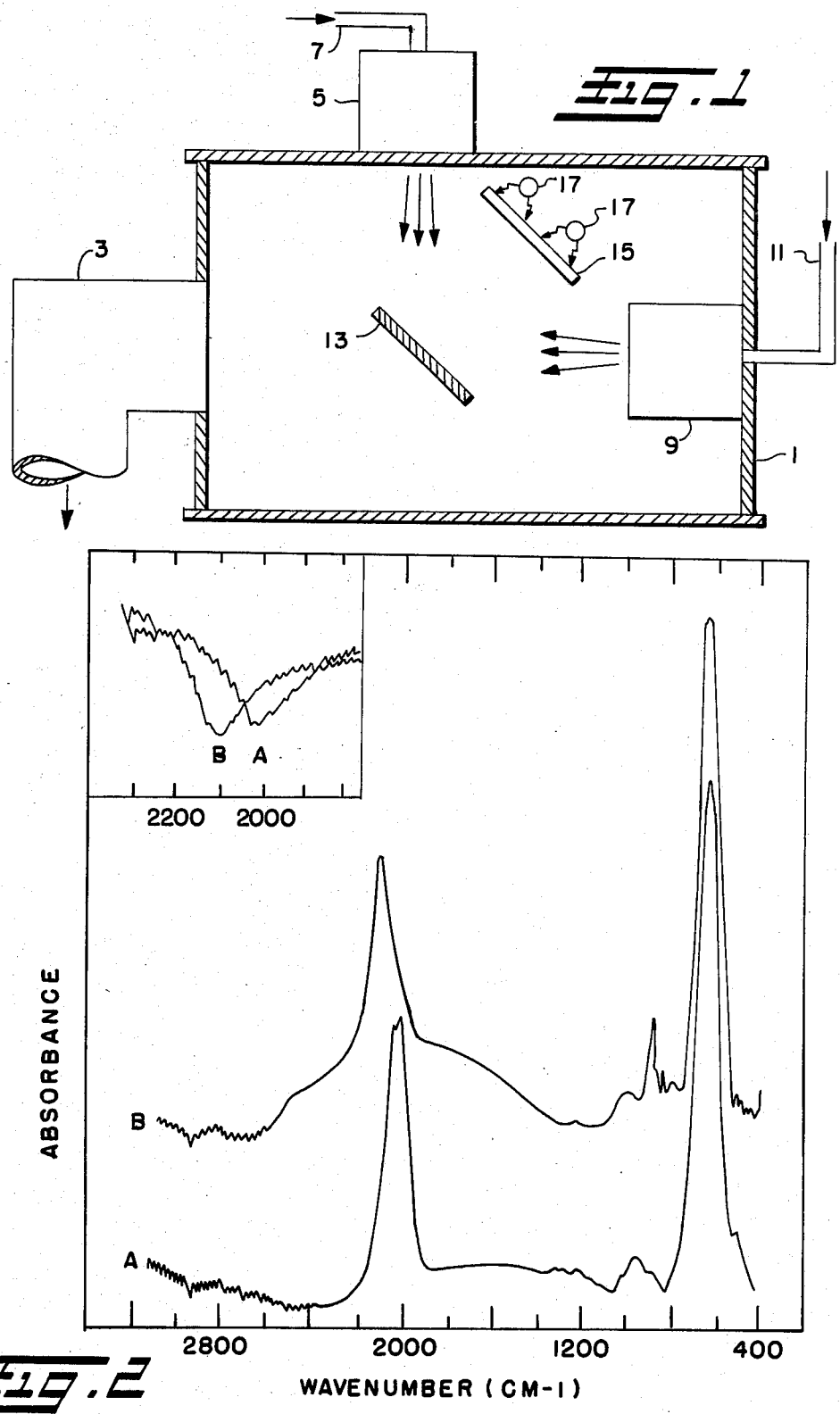
FIG. 1 shows in schematic form a cross-sectional view of an apparatus that may be used to deposit amorphous semiconductor films according to the invention.
FIG. 2 shows relative, representative plots of the measured absorption spectra of two amorphous, hydrogenated elemental semiconductor sample films, one of which was prepared according to the inventive process.

Apparatus for carrying out one embodiment of the inventive process is shown schematically in FIG. 1. A vacuum chamber 1 is evacuated by a vacuum system 3. In our elemental film work we used a steel vacuum chamber 48 cm. in diameter pumped by a liquid nitrogen-trapped diffusion pump having an ultimate pressure of $5 \times 10^{-7}$ torr ($6.66 \times 10^{-5}$ pascal). Chamber 1 is fitted with a first ion source 5 that can produce an ion beam within the chamber. Ion source 5 includes a gas inlet 7 that is connected to a gaseous source of sputtering ions, such as argon. A second ion source 9 is also fitted to chamber 1 to produce a second ion beam. Ion source 9 is connected to a gaseous source 11 of ions effective in passivating localized states in amorphous semiconductor films. We used hydrogen as a passivating gas, but fluorine and other atomic species are also known to be effective.

In a preferred embodiment of the apparatus for performing the invention process, ion sources 5 and 9 are conventional Kaufman type ion sources in which a plasma is created in the gas entering the source. Ions are created in the source by electrons, produced by a heated filament, that strike gas atoms and strip one electron from the atom. By controlling the current through the filament, the rate at which ions are created, and therefore, the ion beam current out of the source may be controlled. The ions extracted from the gas in the plasma are directed out of the source and accelerated by an accelerator grid charged with a negative potential. The energy of the ions is controlled by the voltage on the accelerator grid. A second or screen grid may also be present to suppress secondary emissions from the accelerator grid. We used sources 2.5 cm. in diameter to form each ion beam. Argon was used with source 5 to produce relatively heavy ions that are effective in sputtering a silicon or other elemental semiconductor target. Other gases producing relatively heavy ions may be used instead of argon. Dual graphite grids were used to accelerate the argon ion beam and screen the accelerator grid. Ion source 9 may use a graphite grid or, if the sputtering potential of the gas used is low, as with hydrogen, a metal grid may be used. A single nickel accelerator grid was used with our hydrogen ion source.

Within chamber 1, a sputtering target 13 is mounted by conventional means. The ion beams from sources 5 and 9 are directed to impinge on target 13. In our work with elemental films sputter target 13 was a 12.5 cm. diameter, 99.999 percent pure silicon wafer. That target was water-cooled by conventional means.

One or more substrates 15 are mounted within chamber 1 opposing target 13 to collect the material sputtered from it. Substrates 15 are remotely placed to avoid being sputtered themselves and to avoid collection of undesired sputtering products. Substrates 15 may be heated by a thermal source such as quartz lamps 17. In our elemental film work, three substrates were used: fused silica, 7059 Corning glass and single crystal silicon. Substrates may also be metallic such as stainless steel. The substrates were mounted against a copper backing plate to spread heat evenly. The backing plate was mounted in a stainless steel holder.

To deposit an elemental film, chamber 1 was evacuated to 1 to $2 \times 10^{-6}$ torr (1.33 to $2.7 \times 10^{-4}$ pascal) and the temperature of the substrates was allowed to stabilize for at least one hour. All gases delivered to the ion sources were research grade and the gas lines were purged for 15 minutes before sputtering began. Flow rates to the ion sources were adjusted to produce partial argon and hydrogen pressures of $1.7 \times 10^{-4}$ and $6.6 \times 10^{-4}$ torr ($2.3 \times 10^{-2}$ and $8.8 \times 10$ pascal), respectively. This hydrogen pressure corresponded to a flow rate of 20 sccm. Sputtered films were cooled to at least 75° C. before the venting of chamber 1. Film thicknesses ranged between 0.7 and 1 micrometers and were measured by profilometer. The type of hydrogen bonding in the films was determined from their FTIR absorption spectra. Atomic hydrogen content was calculated from the spectra measured in the vicinity of 640 $cm^{-1}$ using the method of Brodsky, et al. published in Physical Review B16, 3556 (1977).

In our elemental film work, the energy of the hydrogen ion beam (100, 150 200 eV) and the currents of the ion beams (argon: 20, 35, 50 mA; hydrogen: 20, 40, 60 mA) were varied. We accelerated the argon beam with a 1000 volt potential. It is important that the energy of the hydrogen ions be kept relatively low, e.g. below about 1000 electron volts. At energies near and above about 1000 electron volts, the hydrogen ions will ricochet from or embed in the target. If these events occur, the desired semiconductor-hydrogen interaction will not occur, and the deposited film will not be hydrogenated as desired. In addition, in some of the tests, the substrates, instead of the target were bombarded with hydrogen ions and, in some of those tests, krypton was mixed with hydrogen in the second ion source. In some tests, the substrate was illuminated with ultraviolet light. The substrate temperature (100°, 200°, 300° C.) was also varied.

The hydrogenated, elemental amorphous silicon films deposited by the inventive technique are of good physical quality. They are smooth and clear, ranging from red to yellow in color. No columnar growth was observed in scanning electron microscope examination of fractured samples, even after etching in potassium hydroxide.

FIG. 2 shows representative plots of the measured FTIR absorption spectra for two samples. The spectrum curve plotted lower and marked as A was measured from an a-Si:H film prepared according to the invention. The upper spectrum curve designated B was measured from an a-Si:H film prepared by directing the hydrogen ion beam of source 9 to strike the substrate instead of the target. Absorption lines for silicon monohydride and polyhydrides exist at 2000 and 2090 $cm^{-1}$, respectively. The percentage of each bonding configuration was estimated from the relative absorbance maxima of these two lines. Polyhydrides also have bending modes at 840 and 890 $cm^{-1}$ and the presence of such lines indicates the presence of polyhydrides. Curve B of FIG. 2 clearly shows an increase at 2090 $cm^{-1}$ that is not present in curve A. Likewise, the polyhydride bending mode lines are clearly present in curve B, but not curve A. From such spectral measurements it was determined that films prepared according to the invention, i.e., in which the hydrogen ion beam was directed at the sputtering target, were free of polyhydrides. The inset in FIG. 2 shows a higher resolution scan in the range from 2000 to 2100 $cm^{-1}$. These scans show very clearly the presence of the 2090 $cm^{-1}$ line in sample B indicating the presence of polyhydrides, and its absence in sample A that was prepared according to the inventive process.

Figure 3:
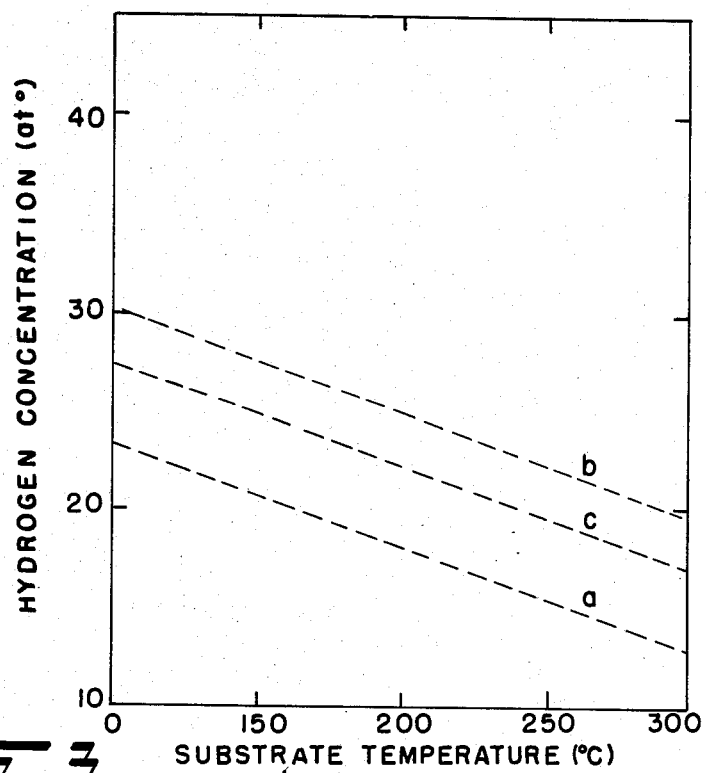
FIG. 3 is a least squares plot of the measured bonded hydrogen concentration as a function of substrate temperature and hydrogen ion beam current for amorphous, hydrogenated elemental semiconductor films prepared according to the invention.

The total measured atomic percent of bonded hydrogen in elemental films we prepared is illustrated in FIG. 3. There, a least squares fit of the measured percentage of total bonded hydrogen present in films prepared according to the invention is plotted against substrate temperature for different hydrogen ion beam currents (a=20 mA, b=40 mA, c=60 mA). In the plotted results, all hydrogen was bound as monohydride regardless of the quantity of hydrogen present.

Figure 4:
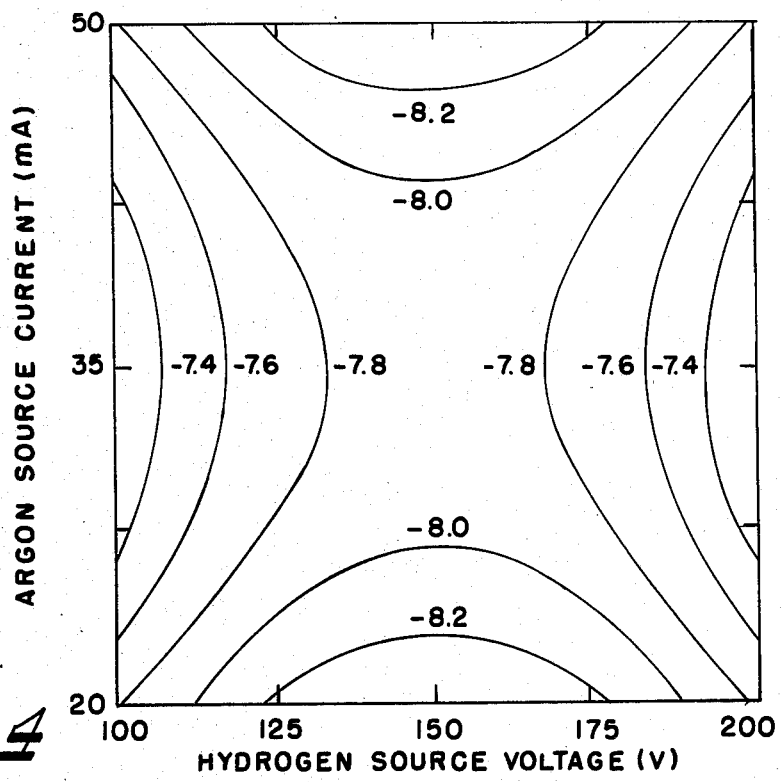
FIG. 4 is a least squares plot of the logarithm of the measured photoconductivity of amorphous, hydrogenated elemental semiconductor films prepared both according to the inventive process and with substrate bombardment by hydrogen ions for a fixed substrate temperature, as a function of argon ion beam current and hydrogen ion beam voltage.

The photoconductivity of the films, $\sigma_p$, is defined as the difference between the conductivity of films measured under light of intensity of 100 mw/cm$^2$, the conductivity in darkness $\sigma_D$. The photoconductivity of elemental, amorphous silicon films deposited on fused silica substrates both according to the inventive process and with hydrogen ions directed at the substrate, was measured using painted carbon contacts. These contacts were tested and determined to be ohmic. Hydrogen beam voltage, argon beam current and substrate temperature were the most significant variables affecting the measured photoconductivity of films prepared according to both processes. A least squares fit of the logarithm of the measured photoconductivity of films prepared according to both processes at a substrate temperature of 300° C., is plotted in FIG. 4 as a function of argon ion beam current and the voltage used to accelerate the hydrogen ion beam. For the conditions used, photoconductivity is maximized at a sputtering source current of 35 mA.

Figure 5:
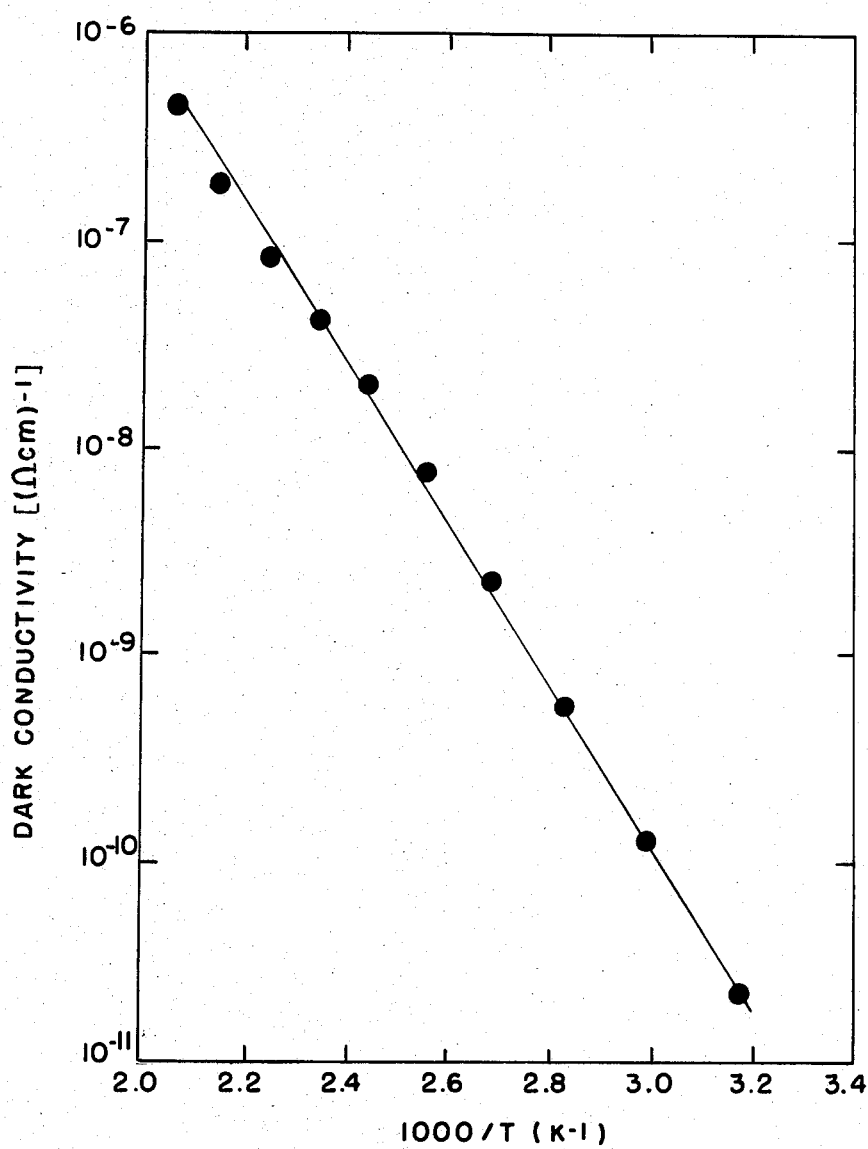
FIG. 5 is a plot of dark conductivity as a function of the reciprocal of temperature for an amorphous, hydrogenated elemental semiconductor film prepared according to the inventive process.

In FIG. 5, the logarithm of the dark conductivity of a hydrogenated elemental amorphous silicon film prepared according to the inventive process is plotted as a function of the reciprocal of temperature. The plot shows a single activation energy further confirming that only monohydrides are present in films prepared according to the invention.

The characteristics of elemental hydrogenated amorphous silicon films deposited according to the inventive process under varying conditions are listed in Table 1 for tests 1, 2, 3, 4, 7, 8, 9 and 10. Tests 5 and 6 are also listed to show results when the hydrogen beam was directed at the substrates rather than at the sputtering target. In the Table, the following measured test conditions and measured results are listed: argon ion beam current, hydrogen ion beam current, hydrogen ion acceleration voltage, substrate temperature, the direction of the hydrogen passivating ion beam (at the sputtering target or at the substrate), presence or absence of ultraviolet illumination of the substrates, measured percentage of silicon monohydride in the deposited film, atomic percentage of hydrogen in the deposited film, and the logarithms of the measured dark conductivity and photoconductivity of the deposited films. The final column in Table 1 lists the activation energy for amorphous hydrogenated elemental silicon films prepared according to the inventive process as measured by the technique producing the results plotted in FIG. 5. Entries of N.A. mean that no single activation energy was measured and that the measured plot was non-linear. As indicated in the Table, a single activation was found for all but one film prepared according to the inventive process. Test 9 produced an anomalous, non-linear result having no single activation energy. By contrast, the activation energy plots of films made during hydrogen ion bombardment of the substrates were always non-linear.

TABLE 1

| Test No. | Ar Curr. (mA) | H Curr. (mA) | H Volt. (V) | Ts (°C.) | H Dir. | UV | Percent SiH | Atomic Percent H | log $\sigma_D$ | log $\sigma_p$ | $E_a$ (eV) |
|---|---|---|---|---|---|---|---|---|---|---|---|
| 1 | 20 | 60 | 200 | 300 | Tar. | Off | 100 | 20 | −11.4 | −7.9 | 0.95 |
| 2 | 50 | 20 | 200 | 100 | Tar. | On | 100 | 23 | −9.2 | −8.6 | 0.89 |
| 3 | 50 | 60 | 100 | 100 | Tar. | On | 100 | 27 | −10.4 | −8.7 | 0.75 |
| 4 | 20 | 20 | 150 | 200 | Tar. | On | 100 | 23 | −11.0 | −9.7 | 0.77 |
| 5 | 35 | 60 | 200 | 200 | Sub. | On | 20 | 36 | −11.0 | −9.1 | N.A. |
| 6 | 50 | 20 | 200 | 100 | Sub. | Off | 0 | 45 | −11.4 | −9.3 | N.A. |
| 7 | 35 | 40 | 100 | 300 | Tar. | On | 100 | 19 | −10.6 | −7.2 | 1.0 |
| 8 | 50 | 20 | 100 | 100 | Tar. | Off | 100 | 23 | −9.5 | −8.6 | 0.66 |
| 9 | 35 | 40 | 200 | 300 | Tar. | Off | 100 | 22 | −10.5 | −6.8 | N.A. |
| 10 | 50 | 60 | 200 | 100 | Tar. | On | 100 | 40 | −10.3 | −8.2 | 0.76 |

The deposition rates of the deposited elemental films varied in direct relation to the current of the sputtering ion beam. We deposited films to an approximate thickness of three quarters of a micrometer without regard to deposition rate. Average deposition rates were about 1.1 micrometer per hour. It is not possible to compare our deposition rates directly with those reported by Ceasar et al. (U.S. Pat. No. 4,376,688), 0.6 micrometer per hour at 3:1 hydrogen to argon gas concentration in the ion source. To increase their sputtering rate. Ceasar et al. had to increase the percentage of argon in their source, i.e. reduce the quantity of hydrogen, because the gas flow rate into the gun is limited. The relative reduction in hydrogen concentration in the ion source means a reduced hydrogen concentration in the film. In our process, that compromise of sputtering rate and hydrogen concentration is not necessary and relatively rapid film deposition rates are maintained throughout the range of hydrogen concentration in the deposited films. Moreover, Ceasar et al. report dark resistivity of hydrogenated amorphous silicon films of up to about $10^9$ ohm cm, characterized as being comparable to the best glow discharge deposited material. The dark resistivities of our hydrogenated amorphous silicon films ranged from $10^9$ to $2 \times 10^{11}$ ohm cm indicating that our more rapidly deposited films are of still better quality than those report by Ceasar et al.

The precise mechanism in the process that produces the desired results is not completely understood. It appears to us that in the deposition of hydrogenated amorphous silicon, silicon polyhydride is formed at the target and that reactive hydrogen, along with silicon, is sputtered onto the substrate. We believe that polyhydride formation in deposited films is primarily the result of large amounts of reactive hydrogen being present at the film surface during film growth. Therefore, conditions that favor polyhydride formation at the sputtering target and reduce the concentration of atomic hydrogen at the substrate, result in an increase of monohydride content in sputtered films.

The inventive process is not limited to use with silicon to produce elemental hydrogenated, amorphous semiconductor films with a reduced density of localized states, but may also be used with other group IVa elements from the periodic table, such as germanium, and appropriate passivating atoms, such as hydrogen or fluorine, to produce high quality amorphous semiconducting films.

Figure 6:
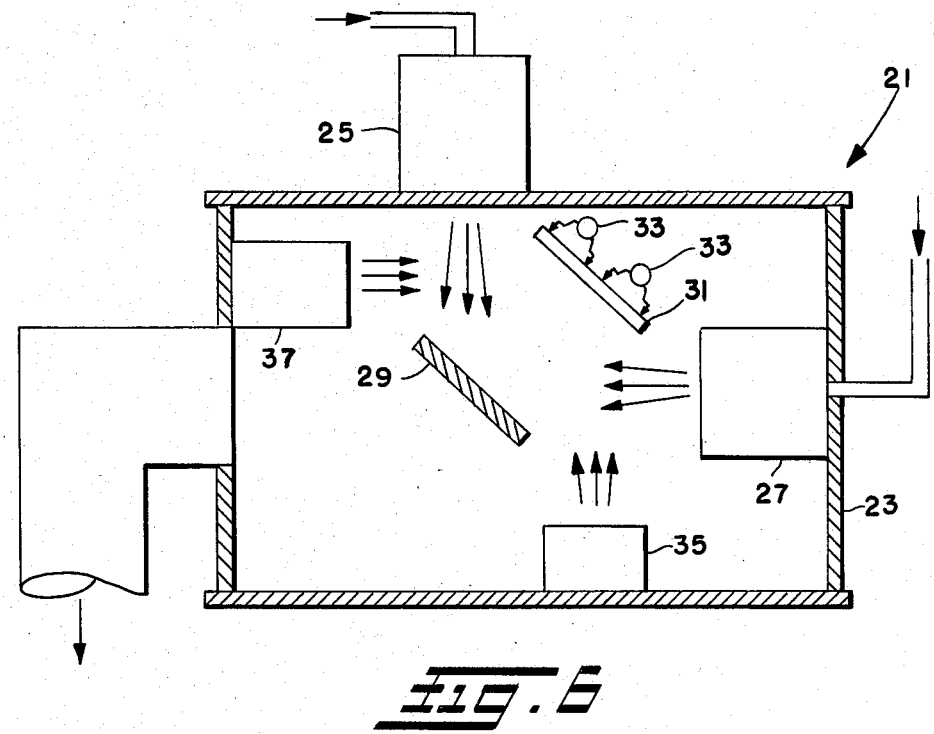
FIG. 6 is a schematic cross-sectional view of an apparatus that may be used to deposit compound semiconductor films according to the invention.

In addition, the inventive process may be used to deposit compound semiconductor passivated films, that is, films containing an alloy of two or more semiconductor elements, plus passivating atoms for reducing the density of localized states. By alloying semiconductor elements, a film having a desired, preselected band gap energy can be produced. An apparatus 21 for producing such compound semiconductor passivated films is shown in schematic cross sectional view in FIG. 6. Apparatus 21 contains many of the same elements as the apparatus of FIG. 1. A vacuum vessel 23 is fitted with two ion sources 25 and 27, which may be conventional Kaufman sources. Ion source 25 is supplied with a sputtering gas, such as argon; source 27 is supplied with a passivating gas, such as hydrogen or a halogen. The beams from ion sources 25 and 27 are directed toward a single sputter target 29 that is water-cooled. Target 29 is composed of a substantially pure alloy of elemental semiconductors such as germanium and silicon. Target 29 may be crystalline or polycrystalline.

The material sputtered from target 29 is collected on a substrate 31 that is located remotely from the ion beams and target to avoid collection of inadvertently sputtered material and to avoid sputtering of the substrate. The temperature of substrate 31 may be elevated by a heat source such as quartz lamps 33. A source of ultraviolet light 35 may be used to illuminate substrate 31 and an electron source 37 may bombard substrate 31.

During deposition, substrate 31 may be heated, illuminated with ultraviolet light and bombarded with electrons, independently or in any combination, to enhance the deposition process. Substrate 31 may be a glass, a semiconductor or a metal such as stainless steel.

By varying the current and energy of the two ion beams separately, the rate of sputtering of target 29 and the passivating atom content of the sputtered products can be independently controlled. As noted above, this feature of the inventive process is particularly important for achieving both a relatively fast deposition rate and the desired coordination of the hydrogen atoms with the semiconductor atoms in deposited hydrogenated amorphous films.

Figure 7:
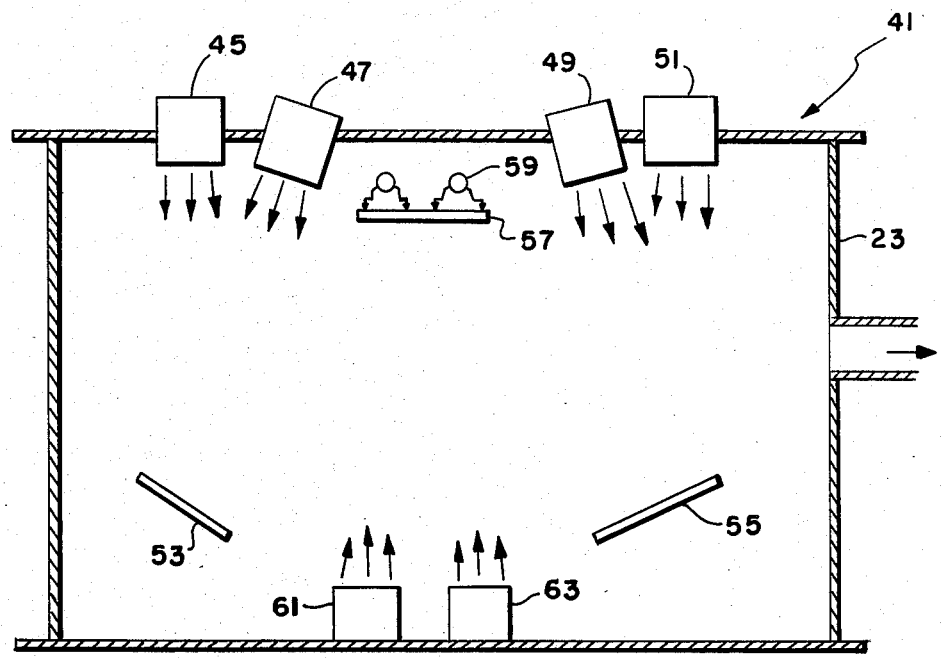
FIG. 7 is a schematic cross-sectional view of an apparatus that may be used to deposit compound semiconductor films according to the invention.

Another apparatus 41 for an application of the inventive process is shown in schematic cross-sectional form in FIG. 7. A vacuum vessel 43 is fitted with four ion sources 45, 47, 49 and 51. Ion sources 45 and 47 are directed at a sputter target 53 which is preferably an elemental semiconductor such as silicon or germanium. Ion source 45 is supplied with a sputtering gas, such as argon, to produce a beam of ions that sputter material from target 53. Source 47 is supplied with a passivating gas to produce a beam of passivating ions that impinge on target 53. Ion sources 49 and 51 are entirely analogous to sources 45 and 47, except that they are directed at another sputter target 55. That target 55 is an elemental semiconductor, such as silicon or germanium, different from the composition of target 53. The deposited alloy will be composed of the materials comprising the two targets 53 and 55. Both targets are water-cooled and are of high purity.

The materials sputtered from targets 53 and 55 are collected on a substrate 57. Substrate 57 is located remotely from the four ion beams and the two targets to avoid collection of inadvertently sputtered material and to avoid sputtering of the substrate. The temperature of the substrate may be elevated by a heat source which may be quartz lamps 59. An ultraviolet light source 61 and electron source 63 are also provided to illuminate and bombard substrate 57 during deposition, if desired. As noted for the other application described, the substrates may be heated, illuminated with ultraviolet light and bombarded with electrons, or any combination or them to enhance the deposition process. The substrate may be a glass, including fused silica, a semiconductor such as silicon, or may be metallic, such as a stainless steel.

By independently varing the currents and energies of the four ion beams used in this application of the inventive process, the rate of sputtering of the respective targets, the composition of the deposited alloy film and the passivating atom content of the sputter products can be carefully controlled. This extreme degree of control is of great importance since the alloy composition and the content and bonding of the passivating atoms in the film, has a very substantial effect upon the electronic properties of the film.

By using either of the two embodiments of the inventive process just described, a continuum of compositions of passivated amorphous alloy films, such as $Si_x$-$Ge_{1-x}(H)$, where x ranges between 0 and 1, can be produced.

Films deposited according to any of the described embodiments of the inventive process may be doped during deposition by adding a gaseous dopant to the passivating ion beam source. Phosphine may be used for preparing n-type material and diborane or boron trifluoride may be used for preparing p-type material. By changing dopants during deposition. junction devices such as p-n and p-i-n structures can be formed in the films. In the embodiments described for depositing compound amorphous semiconductor films, there is a choice of passivating ion sources and the same dopant need not be supplied to each.

The invention has been described with reference to certain preferred embodiments. Various additions and modifications within the spirit of the invention will occur to those of skill in the art. Accordingly, the scope of the invention is limited solely by the following claims.

We claim:

1. A process for depositing a hydrogenated amorphous semiconductor film on a substrate comprising:
   simultaneously directing first and second ion beams, produced by first and second ion sources, respectively, against a first target of a semiconductor material that is to be included in said film, said first ion beam including sputtering ions to sputter material from said first target and said second beam including hydrogen ions to reduce the density of localized states in the deposited film;
   independently controlling the relative energies and currents of ions in said first and second beams so that the sputtering ions are effective in sputtering semiconductor material from said target and so that the energy of said hydrogen ions in the second ion beam does not exceed about 200 electron volts; and
   collecting sputtering products from said first target on said substrate, whereby a film of hydrogenated amorphous semiconductor material substantially free of polyhydrides is efficiently deposited.

2. The process of claim 1 wherein said sputtering ions comprise argon ions.

3. The process of claim 2 wherein said argon ion beam has a current of between approximately 20 to 50 milliamperes.

4. The process of claim 1 wherein said first target comprises substantially pure silicon.

5. The process of claim 4 wherein said hydrogen ion beam has a current of between approximately 20 to 60 milliamperes.

6. The process of claim 4 including elevating the temperature of said substrate to between approximately 100° C. to 300° C.

7. The process of claim 1 including illuminating said substrate with ultraviolet light.

8. The process of claim 1 wherein said first target comprises an element from group IVa of the periodic table.

9. The process of claim 1 wherein said substrate consists of one of the group of glass, fused silica and silicon.

10. The process of claim 1 wherein said substrate is metallic.

11. The process of claim 10 wherein said substrate is a stainless steel.

12. The process of claim 1 wherein said second ion source produces a beam including dopant ions.

13. The process of claim 12 wherein said dopant ions consists of one of the group of boron and phosphorus ions.

14. The process of claim 1 further comprising:
   while directing said first and second ion beams, simultaneously directing third and fourth ion beams, produced by third and fourth ion sources, respectively, against a second target of semiconductor material that is to be included in said film, said second target being of a different composition from said first target, said third ion beam including sputtering ions to sputter said material from said second target, and said fourth beam including hydrogen ions to reduce localized states in the deposited film;
   independently controlling the relative energies and currents of the ions in said third and fourth beams so that the sputtering ions are effective in sputtering semiconductor material from said second target and so that the energy of said hydrogen ions in the fourth beam does not exceed about 200 electron volts; and
   collecting sputtering products from said first and second targets on said substrate. whereby a film of hydrogenated amorphous semiconductor alloy substantially free of polyhydrides is efficiently deposited.

15. The process of claim 14 wherein said first target is substantially pure germanium and said second target is substantially pure silicon.

16. The process of claim 1 including irradiating said substrate with electrons.

17. The process of claim 1 wherein said first target comprises an alloy of at least two elemental semiconductors that are to be deposited as said film.

18. The process of claim 17 wherein said target comprises a substantially pure alloy of silicon and germanium.

* * * * *